United States Patent
Dolan et al.

(10) Patent No.: US 6,794,264 B2
(45) Date of Patent: Sep. 21, 2004

(54) IMPLANTATION PROCESS USING SUBSTOICHIOMETRIC, OXYGEN DOSES AT DIFFERENT ENERGIES

(75) Inventors: Robert P. Dolan, Hudson, NH (US); Bernhardt F. Cordts, III, Ipswich, MA (US); Maria J. Anc, Marlborough, MA (US); Micahel L. Alles, Beverly, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/135,683

(22) Filed: Apr. 30, 2002

(65) Prior Publication Data

US 2002/0123211 A1 Sep. 5, 2002

Related U.S. Application Data

(62) Division of application No. 09/748,526, filed on Dec. 21, 2000, now Pat. No. 6,417,078.
(60) Provisional application No. 60/201,845, filed on May 3, 2000.

(51) Int. Cl.[7] .............................................. H01L 21/76
(52) U.S. Cl. ........................ 438/407; 438/480; 438/479
(58) Field of Search ................................ 438/407, 480, 438/479, 766, 528, 527, 529, 530, 230; 257/301, 347, 345

(56) References Cited

U.S. PATENT DOCUMENTS 4,749,660 A * 6/1988 Short et al. ................. 257/347
5,429,955 A * 7/1995 Joyner et al. ........... 204/192.37
5,661,044 A * 8/1997 Holland et al. ............. 438/766
5,891,265 A * 4/1999 Nakai et al. ................ 148/33.3
5,918,151 A * 6/1999 Tachimori et al. ...... 250/492.21
6,031,261 A * 2/2000 Kang ......................... 257/302
6,090,689 A * 7/2000 Sadana et al. ................ 117/84
6,222,253 B1 * 4/2001 Sadana et al. ............... 257/347
6,333,532 B1 * 12/2001 Davari et al. ............... 257/301
6,417,078 B1 * 7/2002 Dolan et al. ................ 438/407
6,440,807 B1 * 8/2002 Ajmera et al. .............. 438/230

* cited by examiner

*Primary Examiner*—Carl Whitehead, Jr.
*Assistant Examiner*—Laura M Schillinger
(74) *Attorney, Agent, or Firm*—Thomas J. Engellenner; Reza Mollaaghababa; Nutter McClennen & Fish LLP

(57) ABSTRACT

The present invention provides a method for creation of high quality semiconductor-on-insulator structures, e.g., silicon-on-insulator structures, using implantation of sub-stoichiometric doses of oxygen at multiple energies. The method employs sequential steps of ion implantation and high temperature annealing to produce structures with a top silicon layer having a thickness ranging from 10–250 nm and a buried oxide layer having a thickness 30–300 nm. The buried oxide layer has a breakdown field greater than 5 MV/cm. Further, the density of silicon inclusions in the BOX region is less than $2 \times 10^7$ cm$^{-2}$. The process of the invention can be used to create an entire SOI wafer, or be used to create patterned SOI, regions where SOI regions are integrated with non-SOI regions.

8 Claims, 3 Drawing Sheets

IMPLANTATION PROCESS USING SUBSTOICHIOMETRIC, OXYGEN DOSES AT DIFFERENT ENERGIES

RELATED APPLICATIONS

This application is a division of Ser. No. 09/748,526 filed Dec. 21, 2000 now U.S. Pat. No. 6,417,078.

This application claims priority to a provisional application filed on May 3, 2000 and having a Serial No. 60/201,845. This provisional application is herein incorporated by reference.

BACKGROUND OF THE INVENTION

The present invention provides methods for implanting ions in a target substrate. More particularly, the invention provides methods for producing a buried insulating layer, which is substantially free of defects, in a semiconductor substrate.

Ion implantation techniques are useful in forming a class of structures, known as silicon-on-insulator (SOI) structures or semiconductor-on-insulator structure, that have an insulating layer beneath a thin surface silicon or other semiconductor film. SOI structures are of value in construction of semiconductor devices, micro-electro-mechanical systems (MEMS), and optical devices provided that the density of defects in the material is sufficiently low, and the cost of manufacturing the material is acceptable for the intended application.

Implantation of oxygen ions into a silicon wafer to form a buried insulation layer is one method for SOI construction, and is known by the acronym SIMOX (separation by implanted oxygen). It is desirable to decrease the required dose of oxygen ions in a SIMOX process to satisfy certain requirements imposed by device physics, and to decrease the fabrication cost of SOI wafers. However, non-optimized implantation doses can result in creation of defects in the buried oxide layer that lead to poor electrical quality of SOI structures.

A number of approaches nave been suggested in the art to address this problem. Some of these approaches include, for example, the use of a pre-amorphization implant or the use of an internal thermal oxidation step in the process of producing an SOI structure. These approaches typically suffer from a number of limitations. Some of these approaches impose severe constraints on the thickness of the insulating layer and/or the thickness of the overlying silicon layer. Moreover, the manufacturing process associated with these approaches can be cumbersome, difficult to control, and costly.

Accordingly, there exists a need for an improved method for production of SOI structures where the buried oxide layer is substantially free of silicon inclusions.

There exists also a need for an improved method for production of SOI structures which can be readily implemented and is cost efficient.

SUMMARY OF THE INVENTION

The present invention provides a method for producing a buried insulating layer in a semiconductor substrate. The method includes multiple steps of implantation of oxygen ions in a substrate, where each implantation step is followed by an annealing protocol. The substrate is pre-heated before each implantation step to a temperature in a range of 400 to 600° C. A incremental sub-stoichiometric dose of oxygen ions is implanted in the substrate during a first implantation step by exposing the pre-heated substrate to a beam of oxygen ions having an energy in a range of approximately 40 to 210 keV. More preferably, the energy of the oxygen ions is selected to be in a range of about 120 to 145 keV, or alternatively in a range of about 165 to 190 keV. The current of the oxygen beam is preferably selected to be approximately 45 mA to maintain the temperature of the substrate at about 450 to 700° C. in combination with lamp heating.

Subsequent to the first implantation step, the substrate is subjected to an annealing protocol in an inert ambient. An inert ambient as used herein contains a non-oxidizing gas as its main constituent. The inert ambient can have trace amounts of oxygen, e.g., an atmosphere of argon or nitrogen having less than about 1 percent of oxygen. The annealing protocol is typically performed over a period of a few hours and at a number of elevated temperatures. For example, an annealing step can begin at a push temperature of about 800° C., followed by a temperature ramp at a rate of approximately 5–10° C./minute to increase the temperature of the substrate to about 1000° C. Subsequently, the temperature can be increased at a rate of about 2° C./minute to approximately 1300° C. The substrate is held at this temperature for a few hours. Subsequently, the temperature is ramped down to 1000° C. at a rate of, for example, 1–2° C./minute and is further ramped down at a rate of, for example, 5–10° C./minute to about 800° C. The substrate is then pulled and allowed to cool to room temperature (e.g., 20° C.).

A second sub-stoichiometric dose of oxygen, preferably less than the dose in the first implantation step, is then implanted in the substrate by exposing the substrate to oxygen ions having an energy greater than the energy of the ions in the first implantation step. A ratio of the second dose to the first dose is preferably in a range between 0.2 to 0.9, and the energy of the oxygen ions during the second implantation step is higher than their energy during the first implantation step by a value in a range of approximately 5 to 75 keV.

After the second implantation step, the substrate is subjected to a second annealing protocol preferably in an inert ambient atmosphere that is different from the atmosphere in which the first annealing protocol is performed. For example, if the first annealing protocol is performed in an argon atmosphere, the second annealing protocol can be performed in a nitrogen atmosphere. Further, the maximum temperature of the substrate during the second annealing protocol is preferably selected to be higher than the maximum temperature in the first annealing protocol.

An oxidation step can be optionally performed during at least a portion of one of the annealing steps. For example, during the first annealing step when the temperature of the substrate is about 1000° C., the substrate can be subjected to an oxidation step by increasing the oxygen content of the ambient atmosphere to a value in a range of about 1 to 100 percent. Subsequent to the oxidation step, the inert ambient atmosphere can be restored and the annealing step can continue, as described above.

In another aspect of the invention, a capping layer of $SiO_2$ can be deposited on the substrate after the second implantation step and before the second annealing step by methods known in the art, for example, by deposition from a TEOS source. The capping layer advantageously allows employing the same or different atmospheres during the different annealing steps.

Illustrative embodiments of the invention will be described below with reference to the following drawings.

DETAILED DESCRIPTION

The present invention describes a method for providing a SOI structure by employing multiple steps of ion implantation and annealing. Each implantation step is performed at an ion energy that is higher than the ion energy in a previous implantation step, and with an incremental ion dose that is lower than that utilized in a previous step. An annealing step separates two successive implantation steps. Each annealing step is preferably performed in an atmosphere of inert gas. The atmosphere of each annealing step can be different from the atmosphere of a previous annealing step. Further, the maximum temperature of the substrate during each annealing step is selected to be greater than the maximum temperature of the substrate in a previous annealing step.

Figure 1:
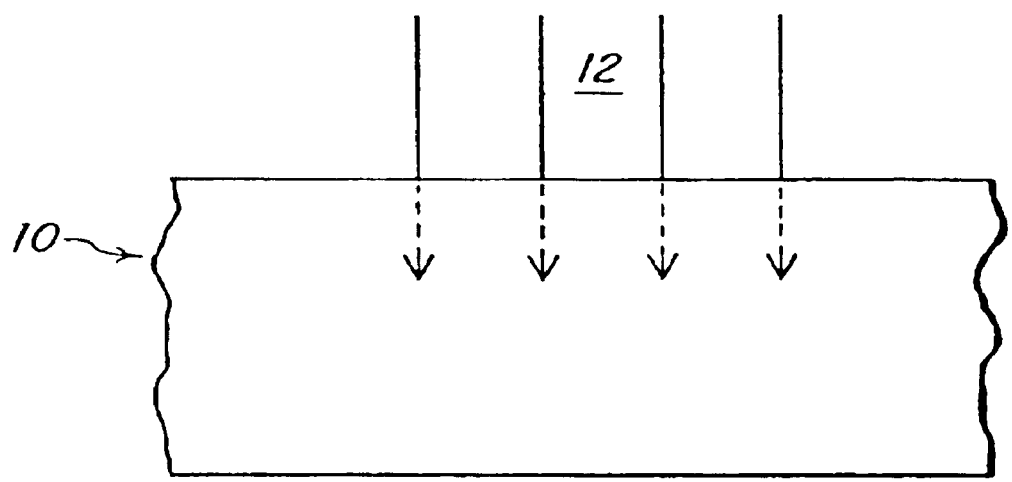
FIG. 1 illustrates schematically a semiconductor substrate exposed to oxygen beams during an implantation step according to the teachings of the invention, FIG. 2A schematically illustrates a buried insulating layer formed in the substrate of the previous figure after a first annealing step following an implantation step.

FIG. 1 schematically illustrates a semiconductor substrate 10, such as a single crystal silicon (Si) wafer, that is exposed to an oxygen ion beam or beams 12 of sufficient energy such that the ions are embedded in the wafer 10 in an initial implantation step. The wafer 10 is preheated to a temperature in a range of approximately 400 to 600° C. before the implantation step. The energy of the ion beam for the initial implantation step is selected to be in a range of approximately 40 to 210 keV. Further, the dose of oxygen ions implanted at the selected ion beam energy is sub-stoichiometric. Currently preferred doses are in the range of about $0.5 \times 10^{16}$ to $1 \times 10^{18}$ cm$^{-2}$.

Figure 2A:
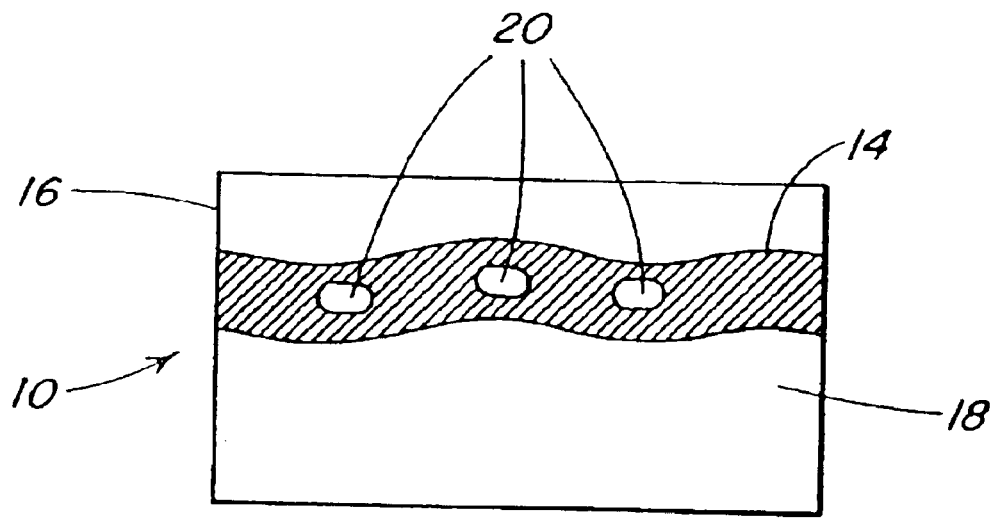
FIG. 2B illustrates schematically the buried insulating layer after a second implantation step and a second annealing protocol performed on the substrate in accord with the teachings of the invention.

With reference to FIG. 2A, subsequent to the initial implantation step, the wafer 10 is subjected to a high temperature annealing protocol in an inert atmosphere, for example an atmosphere of argon or nitrogen having trace amounts of oxygen (oxygen concentrations between 0.5 to 1 percent). The annealing step, for example, can begin at a push temperature of approximately 600–800° C. Subsequently, the temperature can be ramped up at a rate of about 5C./min to approximately 1000° C. The wafer can be subjected to an oxidation step at this temperature by increasing the oxygen content of the ambient atmosphere to about 100%. Subsequently, the inert atmosphere is restored and the temperature is ramped to a value in a range of approximately 1300 to 1400° C. at a rate of about 2° C./minute. The wafer is held at this temperature for a period between 1 and 8 hours, and subsequently the temperature is ramped down to a value below 1000° C. at a rate of 2° C./minute, followed by another ramp down to a temperature of about 600–800° C. The wafer is then pulled and allowed to cool to room temperature (e.g., 20° C.).

The annealing step redistributes the implanted oxygen ions and chemically bonds them to silicon to form a continuous buried layer of silicon dioxide ($SiO_2$) 14, i.e., BOX region, thereby separating an overlying silicon film 16, on the surface of which semi-conductor devices are to be manufactured, from the remaining bulk silicon region 18 below. The BOX region 16 has a thickness in a range of approximately 30 to 300 nm.

At this stage, a number of silicon inclusions, such as exemplary inclusions 20, may be present in the BOX region 16. Such silicon inclusions, which are isolated pockets of silicon within the buried dielectric layer, tend to form within the buried layer and can adversely affect the performance of SIMOX devices by acting as overlapping floating gates. Subsequent steps of the method of the invention, as delineated below, result in substantially eliminating such silicon inclusions, thereby enhancing the performance of devices to be manufactured on the overlying silicon film 14.

In a second implantation step according to the teachings of the invention, the wafer 10 is again exposed to oxygen beams 12 having an energy higher than the ion energy in the initial implantation step. For example, the energy of the oxygen beam can be increased by approximately 5 to 30 keV. Similar to the initial implantation step, the wafer is preheated to a temperature between 400 to 600° C. before the start of the second implantation step. The dose of oxygen ions in the second implantation step is sub-stoichiometric and is lower than the dose in the initial step. In one preferred embodiment of the invention, the ratio of the dose of oxygen ions in the second implantation step to the dose in the initial step is selected to be in a range of about 0.2 to 0.9. The total dose of the implanted ions is selected to be in a range of approximately $3 \times 10^{17}$ to $1 \times 10^{18}$ cm$^{-2}$. A particular value of the total dose within this range can be selected, for example, based on the desired thickness of the buried oxide layer.

Subsequent to the second implantation step, the wafer 10 is subjected to a second annealing protocol performed preferably in an inert atmosphere that is different from the inert atmosphere employed in the first annealing protocol. For example, if the first annealing protocol is performed in an argon atmosphere, the second annealing protocol is performed in a nitrogen atmosphere. Moreover, the highest temperature employed in the second annealing protocol is preferably selected to be greater than the highest temperature employed in the first annealing protocol. The use of different inert gases in different annealing steps advantageously results in low defect densities in the overlying silicon film, i.e., low densities of HF defects, and further results in low surface roughness (for example, rms value of roughness over 0.56 $\mu m^2$ area of the upper silicon surface is less than 3 Angstrom and is less than 15 Angstrom over a similar area of the interface).

Figure 2B:
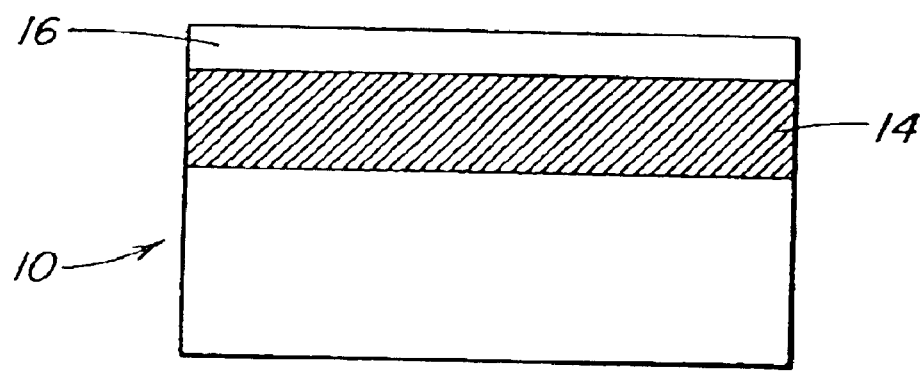

FIG. 2B schematically illustrates that the BOX region 14 is substantially free of silicon inclusions after the second annealing protocol. Further, there exists a smooth interface between the BOX region 14 and the overlying silicon film 16.

Scanning electron microscopy (SEM) cross-sectional images of SOI structures produced in accord with the teachings of the present invention reveal that silicon inclusions in the buried oxide layer are substantially eliminated. In addition, the interface between the buried oxide layer, and the overlying silicon layer and the interface between the buried oxide layer and the bulk silicon layer, are smooth.

Although the above illustrative embodiment includes two implantation steps and two annealing steps, the method of the invention is not limited to any particular number of implantation and annealing steps. Any number of such steps can be utilized, each performed at a sub-stoichiometric dose, to obtain a desired SOI structure. Further, one or more oxidation steps can be used to provide a desired thickness of the top silicon layer. Further, a trace amount of a halogen gas, e.g., chlorine, can be optionally introduced into the ambient atmosphere during an oxidation step. During each oxidation step, a portion of the upper surface of the top silicon layer is oxidized. This oxide layer can be subsequently removed, for example through chemical etching by hydrogen fluoride in a manner known in the art, to obtain an overlying silicon film with a pre-defined thickness.

As discussed above, one advantage of the present invention is minimizing the number of silicon inclusions in the buried insulating layer. Such inclusions not only cause a lowering of the breakdown voltage of the buried insulating layer, but also cause light scattering, referred to as haze, which interferes with optical metrology. Optical metrology can be utilized for measuring the thickness of the buried oxide layer. Further, optical metrology can be utilized to measure particle densities on the upper surface of the overlying silicon layer. The light scattering caused by silicon inclusions can interfere with such measurements. Moreover, such light scattering can diminish the ability to inspect patterns formed on the top silicon layer for manufacturing of devices. It can also adversely interfere with performing optical lithography on the top silicon layer.

Accordingly, minimizing the number of silicon inclusions through the method of the invention provides significant advantages. In addition, the method of the invention can be readily implemented, and further provides significant cost reductions.

Figure 3:
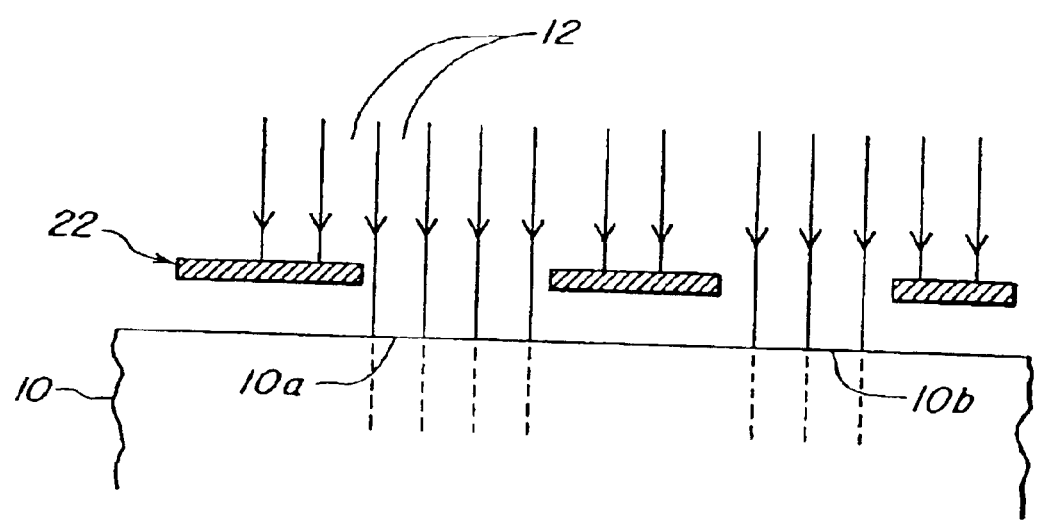
FIG. 3 illustrates schematically an alternative embodiment of the invention which utilizes a mask placed over the top surface of the substrate to produce buried oxide layers in selected portions of the substrate.

FIG. 3 illustrates an alternative embodiment of the invention in which a mask 22 is employed to expose selective portions 10a and 10b of the substrate 10 to oxygen beams 12. This allows implantation of oxygen ions, and consequently formation of a buried oxide layer in selected portions of the substrate 10.

The following embodiments, described in Examples 1 and 2, provide additional illustrations of the method of the invention. It should be, however, clear that various changes, additions and subtractions can be made by those skilled in the art without departing from the spirit or scope of the invention. For example, although the invention is described in the context of creating a buried oxide layer in a silicon substrate, the teachings of the invention also can be applied to other semiconductor substrates. Likewise, other implanted ions can be used, such as, for example, nitrogen ions to produce buried nitride layers.

EXAMPLE 1

In this example, single crystal <100> silicon wafers are preheated to above 450° C. in a high temperature end station. A dose of about $4 \times 10^{17}$ cm$^{-2}$ of oxygen ions is implanted in the wafers by exposing them to beams of oxygen ions having energies of approximately 165 keV. The beam currents are typically about 45 mA so that the wafer temperature during implantation remains above approximately 500° C. to maintain the crystalline quality of the top silicon layer. The wafers are then annealed at a push temperature of approximately 800 C., followed by a temperature ramp at a rate of approximately 5–10° C./minute to increase the temperature of the wafer from about 800° C. to about 1000° C. in an argon atmosphere with a trace of oxygen (oxygen concentration, for example, of less than 1%).

Subsequently, an oxidation step is performed at this temperature by increasing the oxygen content of the ambient atmosphere to a range of approximately 100%. After the oxidation step, the inert atmosphere in argon having a trace of oxygen is restored, and a temperature ramp at a rate of approximately 1° C./minute is applied to the wafer to increase its temperature from 1000° C. to about 1330° C. The wafer is held at this temperature for a period between approximately 4 and 6 hours. Subsequently, the temperature is ramped down at an approximate rate of 1° C./min from 1330° C. to 1000° C., and is further ramped down at a rate of approximately 5–10° C./minute from 1000° C. to a temperature of approximately 800° C. The wafer is pulled at temperature below 800° C. and allowed to cool.

Before the start of a second implantation step, the wafer is again preheated to a temperature of about 450° C. A second lower dose of approximately $3 \times 10^{17}$ cm$^{-2}$ of oxygen ions is implanted in the wafer. The energy of oxygen beam is increased to approximately 190 keV with a beam current above approximately 45 mA so that the wafer temperature during implantation remains above approximately 500° C. The wafer is then annealed in an ambient atmosphere of nitrogen with a trace amount of oxygen at a push temperature of approximately 800° C., followed by a temperature ramp at a rate less than approximately 5–10° C./minute to increase the temperature of the wafer from 800° C. to about 1000° C. The wafer then is subjected to an oxidation step similar to the oxidation step in the first annealing step. Subsequently, the ambient atmosphere of nitrogen with a trace of oxygen is restored and a temperature ramp at a rate of approximately 1° C./minute is applied to the wafer to increase its temperature from 1000° C. to 1350° C. The wafer is held at this temperature for approximately 4 to 6 hours, and then the temperature is ramped down from 1350° C. to 1000° C. at a rate of approximately 1° C./minute. Subsequently, the temperature is ramped down at a rate of approximately 5–10° C./minute from 1000° C. to approximately 800° C., and the wafer is pulled at a temperature lower than 800° C.

The above process creates an SOI structure having a buried oxide layer with a thickness of about 155 nm and an overlying silicon layer having a thickness between about 50 to 255 nm. The structure has a low density of silicon inclusions in the BOX region (less than approximately $2 \times 10^7$ cm$^{-2}$), and a surface roughness with an rms variation that is less than approximately 5 Angstrom. Further, the roughness of the interface between the buried insulating layer and the silicon layer is low (rms variation less than 25 Angstrom). Further, the intrinsic breakdown field of the buried oxide layer is greater than approximately 6.5 MV/cm.

EXAMPLE 2

A single crystal <100> silicon wafer is preheated to above approximately 450° C. in a high temperature end station. An initial dose of approximately $3.3 \times 10^{17}$ cm$^{-2}$ of oxygen ions is implanted in the wafer. The oxygen ions have an energy of about 120 keV with a beam current of approximately 45 mA so that the wafer temperature during implantation remains above 500° C., thereby maintaining crystalline quality of the top silicon layer. The wafer is then annealed in an ambient atmosphere of argon having trace amounts of oxygen at a push temperature of approximately 800° C., followed by a temperature ramp at a rate of approximately 5–10° C./minute to raise the temperature of the wafer from 800 to 1000° C. Subsequently an oxidation step is performed at this temperature with the concentration of oxygen typically selected to be 100%.

Subsequent to the oxidation step, the argon atmosphere is restored and a temperature ramp at a rate of approximately 1° C./minute is applied to the wafer to raise its temperature from 1000° C. to 1330° C. The wafer is held at this temperature for a period between 4 and 6 hours. Subsequently, the temperature is ramped down from 1330 to 1000° C. at a rate of approximately 1° C./minute. The temperature is further ramped down from 1000° C. to approximately 800° C. at a rate of about 5–10° C./minute. The wafer is then pulled and allowed to cool.

The wafer is again pre-heated to about 450° C. before the start of a second implantation step during which a dose of approximately $1.6 \times 10^{17}$ cm$^{-2}$ of oxygen ions is implanted in the wafer. The energy of ions during the second implantation step is approximately 25 keV higher than the energy during the first implantation step, i.e., the second energy is approximately 145 keV. The current of the oxygen beam is selected to be approximately 45 mA so that the wafer temperature during implantation remains approximately 500° C. to maintain crystalline quality of the top silicon layer.

Subsequently, the wafer is subjected to a second annealing protocol in an ambient atmosphere of nitrogen with trace amounts of oxygen. The annealing protocol starts at a push temperature of approximately 800° C., followed by a temperature ramp at a rate of 5–10° C./minute to increase the wafer temperature from 800° C. to 1000° C. An oxidation step is performed at this temperature in an ambient atmosphere of approximately 100% oxygen. Subsequently, the nitrogen atmosphere is restored and the temperature is ramped from 1000° C. to 1350° C. at a rate of about 1° C./minute. The wafer is held at this temperature for a period between 4 to 6 hours. The oxygen concentration is increased to a range between about 5% to 100% for a period between 1 to 5 hours. Subsequently, the nitrogen atmosphere is restored and the temperature is ramped down from 1350 to 1000° C. at a rate of about 1° C./minute followed by a ramp down from 1000° C. to about 800° C. at a rate of about 5–10° C./minute. The wafer is pulled at a temperature of approximately 800° C.

The above process produces an SOI structure having a buried oxide layer with a thickness of about 115 nm and a silicon top layer having a thickness of between about 50 to 200 nm. The SOI structure has a low density of silicon inclusions in the buried oxide layer in the BOX layer (less than approximately $2 \times 10^7$ cm$^{-2}$), a surface roughness having an rms variation of less than 5 Angstrom, and an interface roughness of less than 25 Angstrom. The intrinsic breakdown field of the buried oxide layer is greater than 5 MV/cm.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method of producing a buried insulating layer in a semiconductor substrate, the method comprising the steps of:

exposing said substrate to a beam of oxygen ions having a first energy sufficient for implanting a first incremental sub-stoichiometric dose of oxygen into said substrate, annealing said substrate, and exposing said substrate to a beam of oxygen ions having a second energy for implanting a second incremental sub-stoichiometric dose of oxygen into said substrate, wherein said second energy is higher than said first energy and said second dose is lower than said first dose.

2. The method of claim 1, further comprising the steps of selecting said first energy to be in a range of about 40 to about 210 KeV.

3. The method of claim 1, further comprising the step of selecting said second energy to be in a range of about 40 to about 210 KeV.

4. The method of claim 1, further comprising the step of selecting said first incremental sub-stoichiometric dose of oxygen to be in a range of about $5 \times 10^{15}$ to $1 \times 10^{18}$ cm$^{-2}$.

5. The method of claim 1, further comprising the step of selecting said second incremental sub-stoichiometric dose of oxygen to be in a range of about $1 \times 10^{15}$ to $1 \times 10^{18}$ cm$^{-2}$.

6. The method of claim 1, wherein a ratio of said second incremental dose to said first incremental dose is in a range of about 0.2 to about 0.9.

7. The method of claim 1, wherein a sum of said first and said second incremental doses is in a range of about $5 \times 10^{17}$ to about $1 \times 10^{18}$ cm$^{-2}$.

8. The method of claim 1, wherein a sum of said first and said second incremental doses is in a range of approximately $3 \times 10^{17}$ to $6 \times 10^{17}$ cm$^{-2}$.

* * * * *